United States Patent
Sakai et al.

(10) Patent No.: US 9,456,494 B2
(45) Date of Patent: Sep. 27, 2016

(54) MULTILAYER WIRING SUBSTRATE, PROBE CARD, AND METHOD FOR MANUFACTURING MULTILAYER WIRING SUBSTRATE

(71) Applicant: Murata Manufacturing Co., Ltd., Nagaokakyo-shi, Kyoto-fu (JP)

(72) Inventors: Norio Sakai, Nagaokakyo (JP); Yoshihito Otsubo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 198 days.

(21) Appl. No.: 14/231,780

(22) Filed: Apr. 1, 2014

(65) Prior Publication Data

US 2014/0209356 A1    Jul. 31, 2014

Related U.S. Application Data

(63) Continuation of application No. PCT/JP2012/077048, filed on Oct. 19, 2012.

(30) Foreign Application Priority Data

Oct. 21, 2011  (JP) .................. 2011-231670

(51) Int. Cl.
*H05K 1/09* (2006.01)
*H05K 1/03* (2006.01)
(Continued)

(52) U.S. Cl.
CPC ....... *H05K 1/0298* (2013.01); *H01L 23/49822* (2013.01); *H01L 23/49827* (2013.01);
(Continued)

(58) Field of Classification Search
CPC .......... Y10T 29/49165; H05K 3/4652; H05K 3/4629; H05K 1/0298; H05K 2201/09827; H05K 2201/09709
USPC .................. 174/255, 262–266, 251; 361/760
See application file for complete search history.

(56) References Cited

U.S. PATENT DOCUMENTS 6,127,633 A    10/2000  Kinoshita
6,271,483 B1    8/2001  Horiuchi et al.
(Continued)

FOREIGN PATENT DOCUMENTS

CN    1604721 A    4/2005
JP    10-290059 A    10/1998
(Continued)

OTHER PUBLICATIONS

Official Communication issued in International Patent Application No. PCT/JP2012/077048, mailed on Jan. 22, 2013.
(Continued)

*Primary Examiner* — Sherman Ng
(74) *Attorney, Agent, or Firm* — Keating & Bennett, LLP

(57) ABSTRACT

A multilayer wiring substrate includes a substrate main body and a plurality of wiring lines. The substrate main body includes first and second main surfaces. The plurality of wiring lines extend from the first main surface toward the second main surface side in the substrate main body. The substrate main body includes a plurality of insulator layers laminated on each other. The wiring lines each include via conductors separately provided in the plurality of insulator layers. In at least one of the plurality of wiring lines, a diameter of the via conductor provided in a first insulator layer defining the first main surface of the substrate main body is smaller than a diameter of the via conductor provided in at least one of the plurality of insulator layers other than the first insulator layer.

20 Claims, 17 Drawing Sheets

(51) Int. Cl.
*H05K 1/11* (2006.01)
*H05K 1/02* (2006.01)
*H01L 23/498* (2006.01)
*H05K 3/46* (2006.01)

(52) U.S. Cl.
CPC ............ *H05K1/115* (2013.01); *H05K 3/4652* (2013.01); *H01L 2224/16* (2013.01); *H01L 2924/19105* (2013.01); *H05K 3/4629* (2013.01); *H05K 2201/09709* (2013.01); *H05K 2201/09827* (2013.01); *Y10T 29/49165* (2015.01)

(56) References Cited

U.S. PATENT DOCUMENTS

| | | | | |
|---|---|---|---|---|
| 2005/0067177 A1* | 3/2005 | Saito | ................... | H01L 21/4857 174/521 |
| 2005/0205196 A1* | 9/2005 | Nozaki | ............... | H01L 21/4857 156/89.11 |
| 2006/0289202 A1* | 12/2006 | Takeuchi | .......... | H01L 23/49827 174/262 |
| 2007/0096328 A1* | 5/2007 | Takahashi | .............. | H05K 1/115 257/774 |
| 2008/0138576 A1 | 6/2008 | Nozu et al. | | |
| 2009/0101401 A1* | 4/2009 | Kobayashi | .......... | H05K 1/0271 174/261 |
| 2010/0051323 A1* | 3/2010 | Yokouchi | ............... | B82Y 10/00 174/250 |

FOREIGN PATENT DOCUMENTS

| | | |
|---|---|---|
| JP | 11-284334 A | 10/1999 |
| JP | 2000-133934 A | 5/2000 |
| JP | 2003-163463 A | 6/2003 |
| JP | 2005-72328 A | 3/2005 |
| JP | 2005-072508 A | 3/2005 |
| JP | 2005-277078 A | 10/2005 |
| JP | 2008-164577 A | 7/2008 |
| JP | 2008-300482 A | 12/2008 |
| JP | 2009-188362 A | 8/2009 |
| JP | 2010-109198 A | 5/2010 |
| TW | 200920216 A | 5/2009 |
| WO | 2011/089936 A1 | 7/2011 |

OTHER PUBLICATIONS

Official Communication issued in corresponding Chinese Patent Application No. 2012800514678, mailed on Mar. 22, 2016.

* cited by examiner

MULTILAYER WIRING SUBSTRATE, PROBE CARD, AND METHOD FOR MANUFACTURING MULTILAYER WIRING SUBSTRATE

BACKGROUND OF THE INVENTION

1. Field of the Invention

The present invention relates to a multilayer wiring substrate, a probe card equipped with the multilayer wiring substrate, and a method for manufacturing the multilayer wiring substrate.

2. Description of the Related Art

Nowadays, multilayer wiring substrates, on the main surfaces of which components such as ICs are mounted, are widely used. The multilayer wiring substrate includes a plurality of wiring lines extending from the mounting surface to the rear surface thereof. Each of the plurality of wiring lines includes a plurality of via conductors, which are electrically connected to one another.

Multilayer wiring substrates are described, for example, in Japanese Unexamined Patent Application Publication No. 2008-300482 and Japanese Unexamined Patent Application Publication No. 2008-164577. In these multilayer wiring substrates, the pitch of the wiring lines on the mounting surface is smaller than that on the rear surface.

Nowadays, the size of electronic components such as ICs to be mounted on the multilayer wiring substrates is further being reduced. As the size of the electronic components is reduced, there is a demand for reduction of the pitch of the wiring lines on the mounting surface.

SUMMARY OF THE INVENTION

Preferred embodiments of the present invention provides a multilayer wiring substrate in which a pitch of wiring lines on a mounting surface is small.

A first multilayer wiring substrate according to a preferred embodiment of the present invention includes a substrate main body and a plurality of wiring lines. The substrate main body includes first and second main surfaces. The plurality of wiring lines extend from the first main surface toward the second main surface side in the substrate main body. The substrate main body includes a plurality of insulator layers laminated one on top of another. The wiring lines each include via conductors separately provided in the plurality of insulator layers. In at least one of the plurality of wiring lines, a diameter of the via conductor provided in a first insulator layer that defines the first main surface of the substrate main body is smaller than a diameter of the via conductor provided in at least one of the plurality of insulator layers other than the first insulator layer in the plurality of insulator layers.

In a certain aspect of the first multilayer wiring substrate according to a preferred embodiment of the present invention, in at least one of the plurality of wiring lines, the diameter of the via conductor provided in the first insulator layer is smaller than a diameter of the via conductor provided in any one of the plurality of insulator layers other than the first insulator layer in the plurality of insulator layers.

In a certain different aspect of the first multilayer wiring substrate according to a preferred embodiment of the present invention, a thickness of the first insulator layer is smaller than a thickness of at least one of the plurality of insulator layers other than the first insulator layer in the plurality of insulator layers.

In another certain aspect of the first multilayer wiring substrate according to a preferred embodiment of the present invention, the thickness of the first insulator layer is smaller than a thickness of each of the plurality of insulator layers other than the first insulator layer.

In yet another certain aspect of the first multilayer wiring substrate according to a preferred embodiment of the present invention, in the first main surface, a recess portion is provided between the adjacent wiring lines.

In another certain different aspect of the first multilayer wiring substrate according to a preferred embodiment of the present invention, each of the adjacent wiring lines is exposed at a wall surface of the recess portion.

A second multilayer wiring substrate according to another preferred embodiment of the present invention includes a substrate main body and a plurality of wiring lines. The substrate main body includes first and second main surfaces. The plurality of wiring lines extend from the first main surface toward the second main surface side in the substrate main body. In the first main surface, a recess portion is provided between the adjacent wiring lines.

In a certain aspect of the second multilayer wiring substrate according to a preferred embodiment of the present invention, each of the adjacent wiring lines is exposed at a wall surface of the recess portion.

In a certain aspect of each of the first and second multilayer wiring substrates according to various preferred embodiments of the present invention, the recess portion surrounds portions of the wiring lines, the portions being exposed at the first main surface.

In a certain different aspect of the second multilayer wiring substrate according to a preferred embodiment of the present invention, the substrate main body includes a plurality of insulator layers laminated one on top of another. The wiring lines each include via conductors separately provided in the plurality of insulator layers.

In another certain aspect of the second multilayer wiring substrate according to a preferred embodiment of the present invention, the via conductors provided in the insulator layer that defines the first main surface include a portion that increases in size from a surface on a side opposite to the first main surface toward the first main surface side in the insulator layer.

In a certain aspect of each of the first and second multilayer wiring substrates according to various preferred embodiments of the present invention, in the insulator layer that defines the first main surface, the recess portion extends to a surface located on a side opposite to the first main surface.

In another certain aspect of each of the first and second multilayer wiring substrates according to various preferred embodiments of the present invention, a distance between the adjacent wiring lines increases from the first main surface side toward the second main surface side.

In a certain different aspect of each of the first and second multilayer wiring substrates according to various preferred embodiments of the present invention, at least one of the plurality of via conductors has a shape that tapers from the second main surface side toward the first main surface side.

In yet another certain aspect of each of the first and second multilayer wiring substrates according to various preferred embodiments of the present invention, in each of the wiring lines, the plurality of via conductors are electrically directly connected to one another.

In another certain different aspect of each of the first and second multilayer wiring substrates according to various preferred embodiments of the present invention, the central axes of the via conductors extend in a thickness direction of the insulator layers.

In yet another certain aspect of each of the first and second multilayer wiring substrates according to various preferred embodiments of the present invention, at least one of the plurality of wiring lines includes a portion in which wall surfaces of the via conductors adjacent to one another in the thickness direction are at least partially continuous with one another.

In another certain different aspect of each of the first and second multilayer wiring substrates according to various preferred embodiments of the present invention, at least one of the plurality of wiring lines includes a portion in which the via conductors adjacent to one another in the thickness direction in combination have a shape that tapers from the second main surface side toward the first main surface side.

A probe card according to yet another preferred embodiment of the present invention includes the first or second multilayer wiring substrate according to any of the above-described preferred embodiments of the present invention.

A method for manufacturing a multilayer wiring substrate according to a further preferred embodiment of the present invention relates to a method for manufacturing the first or second multilayer wiring substrate according to any of the above-described preferred embodiments of the present invention. In the method for manufacturing a multilayer wiring substrate according to a preferred embodiment of the present invention, a plurality of ceramic green sheets to define the insulator layers are prepared. Through holes are formed in the plurality of ceramic green sheets. The through holes are filled with electrically conductive paste to form the via conductors. A raw multilayer structure is fabricated by laminating the plurality of ceramic green sheets, the through holes of which have been filled with the electrically conductive paste. The multilayer wiring substrate is obtained by firing the raw multilayer structure. The through holes are performed by irradiating the ceramic green sheets with laser light.

In a certain aspect of the method for manufacturing a multilayer wiring substrate according to a preferred embodiment of the present invention, in one of the ceramic green sheets, a plurality of the through holes are formed such that the adjacent through holes are connected to one another on one main surface side. The one ceramic green sheet is laminated as an outermost layer so that the one main surface forms a main surface of the raw multilayer structure.

According to various preferred embodiments of the present invention, a multilayer wiring substrate, in which the pitch of the wiring lines on the mounting surface is small, is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
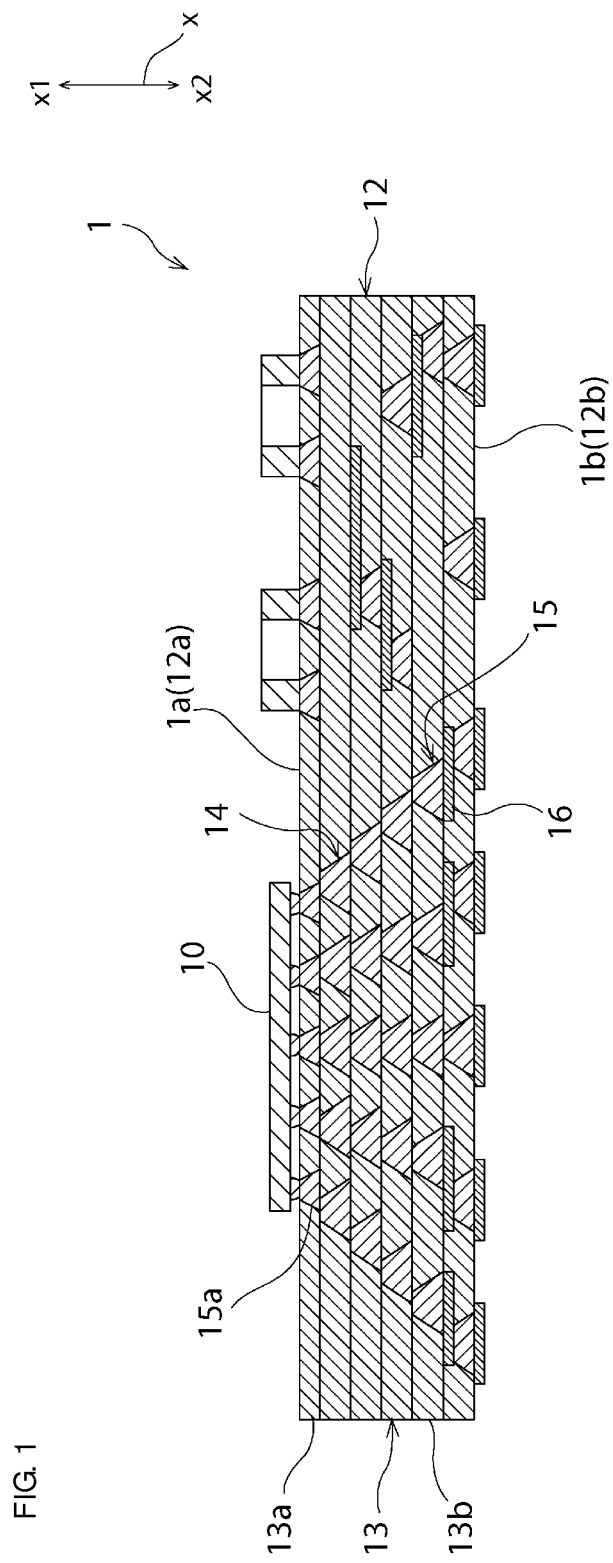
FIG. 1 is a schematic sectional view of a multilayer wiring substrate according to a first preferred embodiment of the present invention.

Non-limiting examples of preferred embodiments of the present invention will be described below. It should be understood that the following preferred embodiments are only illustrative. The present invention is not limited to the following preferred embodiment in any sense.

Also, in the drawings referred to in the preferred embodiments and the like, elements having effectively the same functions are denoted by the same reference signs. The drawings referred to in the preferred embodiments and the like are schematically illustrated. The ratios of the dimensions and the like of elements illustrated in the drawings are not necessarily the same as those of the actual elements. The ratios of the dimensions and the like of the elements in different drawings may be different from one another. Specific ratios of the dimensions of the elements and the like should be determined in consideration of the following description.

First Preferred Embodiment

Figure 2:
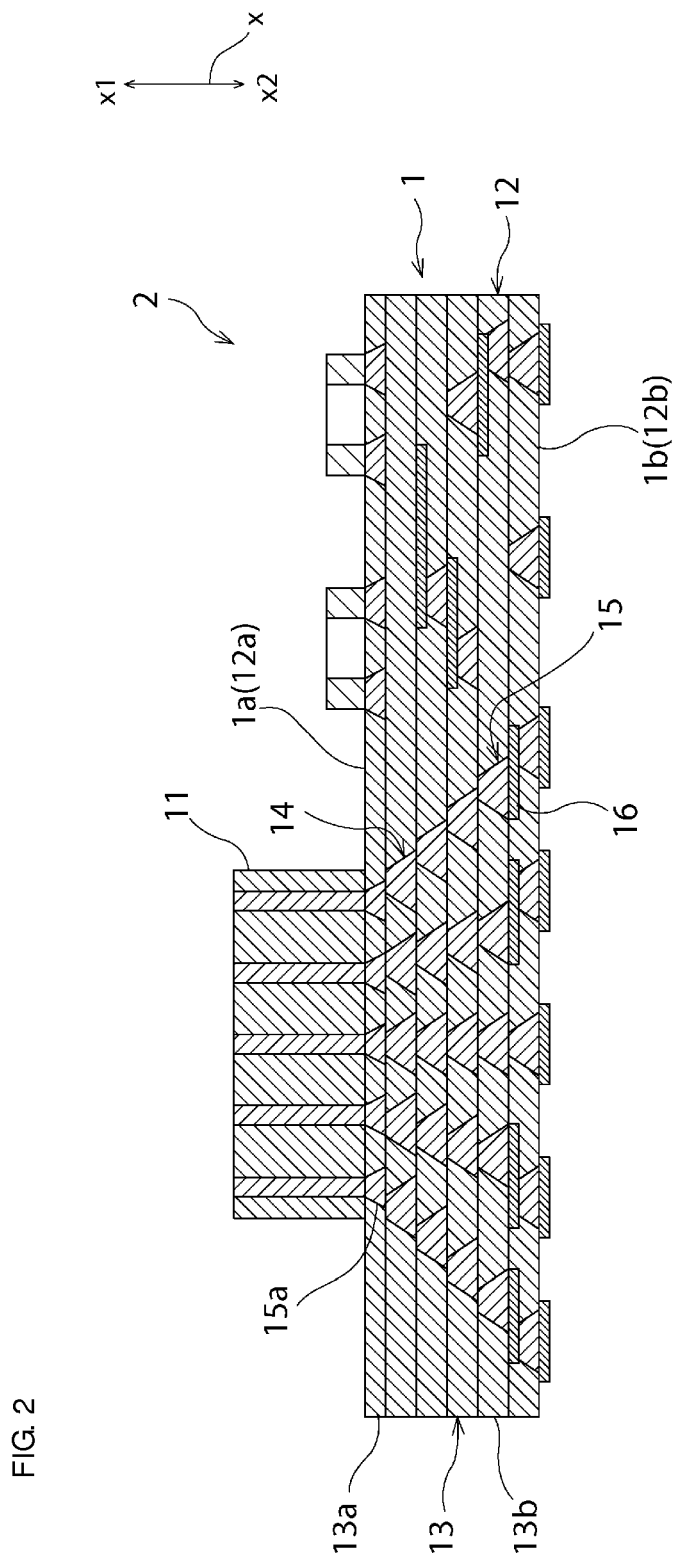
FIG. 2 is a schematic sectional view of a probe card according to a first preferred embodiment of the present invention.

FIG. 1 is a schematic sectional view of a multilayer wiring substrate 1 according to a first preferred embodiment of the present invention. The multilayer wiring substrate 1 includes a mounting surface 1a and a rear surface 1b. For example, an electronic component 10 such as an IC chip is mounted on the mounting surface 1a of the multilayer wiring substrate 1. Also, as illustrated in FIG. 2, for example, a probe unit 11 may be attached to the mounting surface 1a so that the multilayer wiring substrate 1 is used for a probe card 2.

The multilayer wiring substrate 1 includes a substrate main body 12. The substrate main body 12 includes first and second main surfaces 12a and 12b. The mounting surface 1a is defined by the first main surface 12a of the substrate main body 12. The rear surface 1b is defined by the second main surface 12b of the substrate main body 12.

The substrate main body 12 has insulating properties. The substrate main body 12 includes a plurality of insulator layers 13 laminated one on top of another. The material of the insulator layers 13 is not particularly limited as long as the material is an insulator. The insulator layers 13 may be made of, for example, a ceramic material, a resin, or the like, which has insulating properties. Here, in the following description, it is assumed that the insulator layers 13 are made of a ceramic material, for example.

Specific examples of preferable ceramic material include, for example, a low temperature co-fired ceramic (LTCC) material, a high temperature co-fired ceramic (HTCC) material, and the like. Here, the low temperature co-fired ceramic refers to a ceramic material that can be fired at a temperature of equal to or lower than about 1050° C. and can be co-fired with Au, Ag, Cu, or the like having a low resistivity, for example.

Specific examples of the low temperature co-fired ceramic material include, for example, a glass composite-based LTCC material formed by mixing borosilicate glass with a ceramic powder such as alumina, zirconia, magnesia, forsterite, or the like, a crystallized glass-based LTCC material using a $ZnO$—$MgO$—$Al_2O_3$—$SiO_2$-based crystallized glass, a non-glass based LTCC material using a $BaO$—$Al_2O_3$—$SiO_2$-based ceramic powder, $Al_2O_3$—$CaO$—$SiO_2$—$MgO$—$B_2O_3$-based ceramic powder, or the like.

Specific examples of high temperature co-fired ceramic material include, for example, a ceramic material formed by adding a sintering additive such as glass to alumina, aluminum nitride, mullite, or another ceramic and can be fired at a high temperature of equal to or higher than about 1100° C.

The number and the thicknesses of layers of the insulator layers 13 can be appropriately set in accordance with a circuit configuration of the multilayer wiring substrate 1 and the like. The number of layers of the insulator layers 13 can be, for example, about 5 to 30. The thicknesses of individual layers of the insulator layers 13 can be, for example, about 5 μm to about 50 μm. When the substrate main body 12 is used as the probe card 2, the number of layers of the insulator layers 13 can be, for example, about 20 to 100. The thicknesses of individual layers of the insulator layers 13 can be, for example, about 5 μm to about 200 μm.

In the present preferred embodiment, the thickness of a first insulator layer 13a out of the plurality of insulator layers 13 is smaller than the thickness of at least one of insulator layers 13b, which are layers of the plurality of insulator layers 13 other than the first insulator layer 13a. The first main surface 12a is defined by the first insulator layer 13a. Specifically, in the present preferred embodiment, the thickness of the first insulator layer 13a is smaller than the thickness of each of the plurality of insulator layers 13b.

Preferably, the thickness of the first insulator layer 13a is equal to or smaller than about ¾, for example, of that of the thickest layer out of the plurality of insulator layers 13b. More preferably, the thickness of the first insulator layer 13a is equal to or smaller than about ½, for example, of that of the thickest layer out of the plurality of insulator layers 13b. Specifically, it is preferable that the thickness of the first insulator layer 13a be equal to or smaller than about 75 μm, and more preferably, equal to or smaller than about 50 μm, for example. However, when the thickness of the first insulator layer 13a is excessively small, it is difficult to form the first insulator layer 13a. Accordingly, it is preferable that the thickness of the first insulator layer 13a be equal to or larger than about 5 μm, and more preferably, equal to or larger than about 10 μm, for example.

The thicknesses of the plurality of insulator layers 13 may be the same or different from one another. That is, the plurality of insulator layers 13 may include a plurality of types of insulator layers having thicknesses different from one another.

A plurality of wiring lines 14 are provided in the substrate main body 12. The plurality of wiring lines 14 extend from the first main surface 12a to the second main surface 12b. The distance between the adjacent wiring lines 14 increases from the first main surface 12a side (x1 side) toward the second main surface 12b side (x2 side). Thus, the distance between the adjacent wiring lines 14 are larger in the second main surface 12b than in the first main surface 12a.

The wiring lines 14 each include via conductors 15 separately provided in the plurality of insulator layers 13. Specifically, some of the plurality of wiring lines 14 include the via conductors 15 separately provided in the plurality of insulator layers 13, and the other wiring lines 14 each include the via conductors 15 separately provided in the plurality of insulator layers 13 and electrodes 16. The electrodes 16 are each provided at an interface between the insulator layers 13 adjacent to one another in the thickness direction x.

The material of the via conductors 15 and the electrodes 16 are not particularly limited as long as the via conductors 15 and the electrodes 16 are made of an electrically conductive material. The via conductors 15 and the electrodes 16 can be each formed of, for example, a metal mainly composed of at least one of Ag, Cu, Ni, Pt, Pd, W, Mo, and Au. Examples of a metal mainly composed of a plurality of metals from among Ag, Cu, Ni, Pt, Pd, W, Mo, and Au include, for example, an Ag—Pt alloy, an Ag—Pd alloy, and the like. Among the above-described metals, Ag, the Ag—Pt alloy, the Ag—Pd alloy, and Cu have low resistivity. Thus, Ag, the Ag—Pt alloy, the Ag—Pd alloy, and Cu are preferably used as the material of the wiring lines 14. In particular, these metals are more preferably used as the material of the wiring lines 14 of the multilayer wiring substrate 1 used for a high-frequency application.

When the insulator layers 13 are made of a high temperature co-fired ceramic material, a metal including at least one metal selected from the group consisting of Mo, Pt, Pd, W, and Ni is preferably used as the material of the wiring lines 14.

The via conductors 15 are arranged such that the central axes of the via conductors 15 extend in the thickness direction of the insulator layers 13. That is, the central axes of the via conductors 15 are parallel or substantially parallel to the thickness direction of the insulator layers 13.

The via conductors 15 have a shape tapering from the second main surface 12b side (x2 side) toward the first main surface 12a side (x1 side).

In at least one of the plurality of wiring lines 14, the diameter of a via conductors 15a provided in the first insulator layer 13a is smaller than the diameter of the via conductor 15 provided in at least one of the plurality of insulator layers 13b. More specifically, in at least one of the plurality of wiring lines 14, the diameter of the via conductor 15a provided in the first insulator layer 13a, the diameter of the via conductor 15a measured on the second main surface 12b side surface of the first insulator layer 13a, is smaller than the diameter of the via conductor 15 provided in at least one of the plurality of insulator layers 13b, the diameter of the via conductor 15 measured on the second main surface 12b side surface of the at least one insulator layer 13b. Particularly, in at least one of the plurality of wiring lines 14, the diameter of the via conductor 15a provided in the first insulator layer 13a, the diameter of the via conductor 15a measured on the second main surface 12b side surface of the first insulator layer 13a, is smaller than the diameter of the via conductor 15 provided in any one of the insulator layers 13b, the diameter the via conductor 15 measured on the second main surface 12b side surface of the insulator layer 13b. More particularly, in each of the plurality of wiring lines 14, the diameter of the via conductor 15a provided in the first insulator layer 13a, the diameter of the via conductor 15a measured on the second main surface 12b side surface of the first insulator layer 13a, is smaller than the diameter of the via conductor 15 provided in any one of the plurality of insulator layers 13b, the diameter of the via conductor 15 measured on the second main surface 12b side surface of the insulator layer 13b.

The diameter of the via conductors 15a can be, for example, about 20 μm to about 100 μm. The diameter of the via conductors 15 other than the via conductors 15a can be, for example, about 40 μm to about 200 μm. The diameter of the via conductors 15a is preferably equal to or smaller than about ½ times the diameter of the via conductors 15 other than the via conductors 15a, and more preferably equal to or smaller than about ⅕ times the diameter of the via conductors 15 other than the via conductors 15a, for example.

Next, a non-limiting example of a method for manufacturing the multilayer wiring substrate 1 is described. A plurality of ceramic green sheets for forming the insulator layers 13 are initially prepared. In the present preferred embodiment, the thickness of the first insulator layer 13a is different from that of at least the insulator layers 13b. Thus, it is required that the ceramic green sheet to define the first insulator layer 13a and the ceramic green sheets to define the insulator layers 13b are separately prepared. The thickness of the ceramic green sheet to define the first insulator layer 13a is smaller than that to define the ceramic green sheets for the insulator layers 13b.

The ceramic green sheets can be produced by, for example, coating a ceramic slurry on carrier films and drying the ceramic slurry. The ceramic slurry can be coated by, for example, a printing method such as a doctor blade method.

Next, through holes (via holes) to define the via conductors are formed in the ceramic green sheets. The through holes can be formed by, for example, irradiating the ceramic green sheets with laser light or using a punch. Among these methods, the through holes are preferably formed by using the laser light. The reason for this is because the through holes can be formed with high positional and form accuracy. The formation of the through holes by using the laser light can be performed even when forming through holes that are inclined relative to the thickness direction of the ceramic green sheets. However, it is particularly preferable when the through holes are formed along the thickness direction of the ceramic green sheets.

The through holes formed by using the laser light have a shape tapering in a traveling direction of the laser light.

Next, the via conductors are formed in the through holes having been formed in the ceramic green sheets. The via conductors can be formed by, for example, filling electrically conductive paste in the through holes. The through holes can be filled with the electrically conductive paste by using, for example, suction or vacuum printing.

Next, a plurality of ceramic green sheets are appropriately laminated such that the ceramic green sheet to define the first insulator layer 13a becomes the topmost layer, thus producing a raw multilayer structure. The raw multilayer structure may be pressed.

After that, the multilayer wiring substrate 1 is completed by firing the raw multilayer structure.

As described above, in the present preferred embodiment, the thickness of the first insulator layer 13a that defines the first main surface 12a of the substrate main body 12 is smaller than the thickness of at least one of the insulator layers 13b other than the first insulator layer 13a in the plurality of insulator layers 13. More specifically, the thickness of the first insulator layer 13a is smaller than the thickness of each of the insulator layers 13b. Thus, the pitch of the wiring lines 14 on the mounting surface 1a is significantly reduced. The reason for this is described in detail with reference to FIGS. 3A and 3B.

Figure 3A:
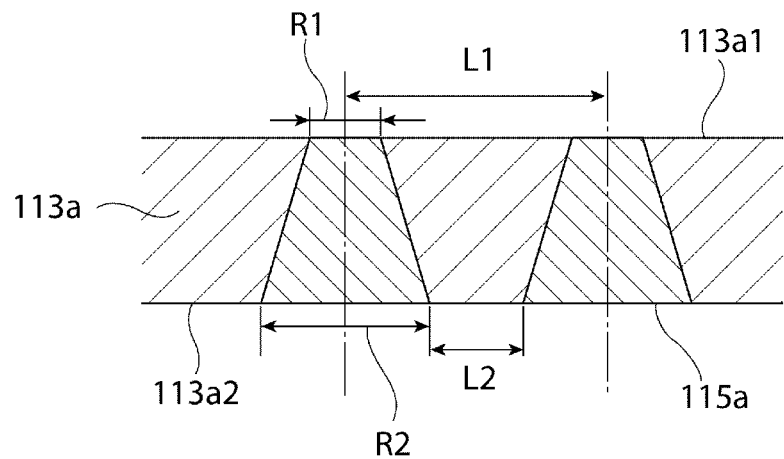
FIGS. 3A and 3B are a schematic sectional view of a thick first insulator layer and a schematic sectional view of a thin first insulator layer, respectively.

As illustrated in FIG. 3A, since a diameter R2 of a via conductors 115a on a main surface 113a2 is large relative to a diameter R1 of the via conductors 115a on a main surface 113a1, the diameter R2 needs to be increased when a first insulator layer 113a is thick. This is because the diameter R1 needs to have a size equal to or larger than a certain size in order to ensure reliable electrical connection.

Figure 3B:
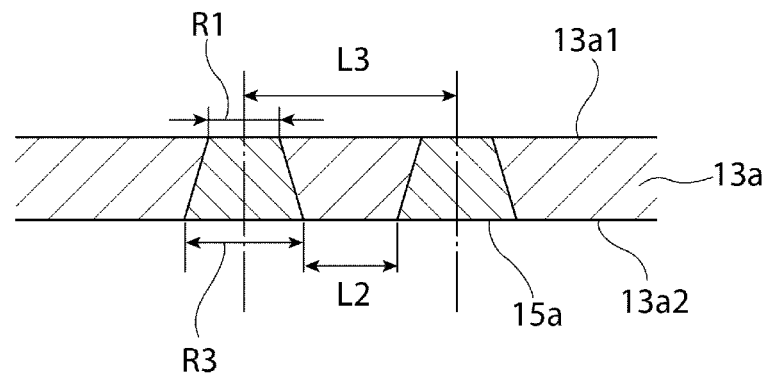

In contrast, as illustrated in FIG. 3B, when the first insulator layer 13a is thin, a diameter R3 of the via conductors 15a in a main surface 13a2 is not so much increased relative to the diameter R1 of the via conductors 15a on a main surface 13a1 as the case illustrated in view of FIG. 3A. That is, R3<R2 is preferably satisfied. This allows the following relationship to be satisfied: distance between centers of via conductors 15a, L3=L2+R3<distance between centers of via conductors 115a, L1=L2+R2. From this, it can be understood that, by setting the thickness of the first insulator layer 13a smaller than the thickness of at least one of the insulator layers 13b, the pitch of the wiring lines 14 on the mounting surface 1a is significantly reduced. From the viewpoint of further reducing the pitch of the wiring lines 14 on the mounting surface 1a, it is preferable that the thickness of the first insulator layer 13a be smaller than the thickness of each of the insulator layers 13b. The distance between centers L2 is a factor determined by processing accuracy of a mechanical punch or the laser for forming a hole and set to the same value.

Also from the viewpoint of further reducing the pitch of the wiring lines 14 on the mounting surface 1a, in the wiring lines 14, the diameter of the via conductors 15a formed in the first insulator layer 13a (specifically, the diameter R3 of the via conductors 15a on the second main surface 12b side surface of the first insulator layer 13a) is preferably smaller than the diameter of at least one of the via conductors 15 other than the via conductors 15a (particularly, the diameter of the via conductors 15 on the second main surface 12b side surface of the insulator layers 13b), and is more preferably smaller than the diameter of each of the via conductors 15 other than the via conductors 15a. The reason for this is that, in this case, the distance between the centers L3 (=L2+R3) of the adjacent via conductors 15a is even more reduced.

In the present preferred embodiment, the via conductors 15 have a shape tapering from the second main surface 12b side toward the first main surface 12a side. This facilitates an increase in the distance between the wiring lines on the second main surface 12b while reducing the distance between the wiring lines 14 on the first main surface 12a.

Other examples of preferred embodiments of the present invention will be described below. In the following description, elements having effectively the same functions as those of the above-described first preferred embodiment are denoted by the same reference signs, and description thereof is omitted.

Second and Third Preferred Embodiments

Figure 4:
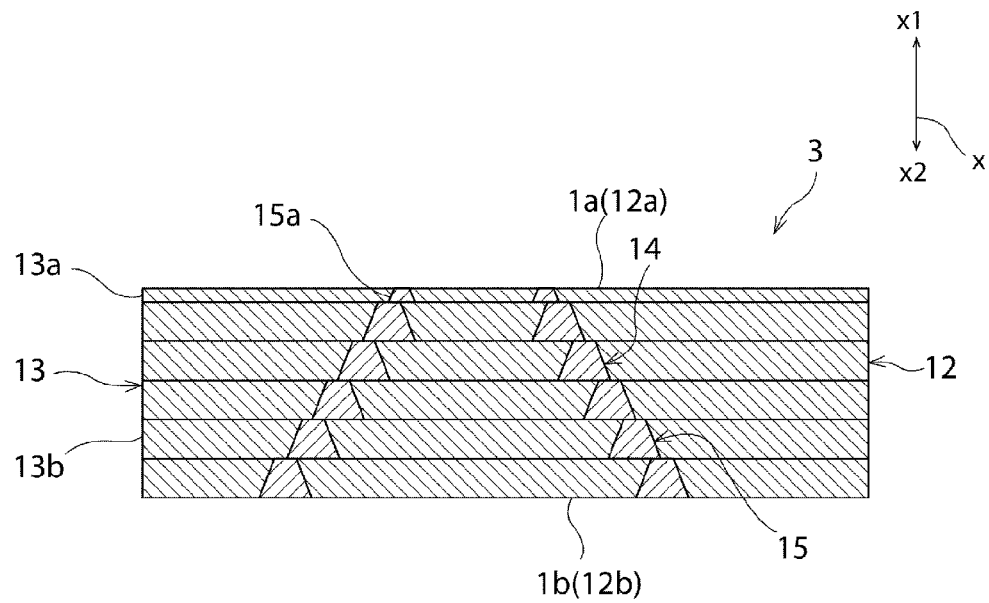
FIG. 4 is a schematic sectional view of a multilayer wiring substrate according to a second preferred embodiment of the present invention.
Figure 5:
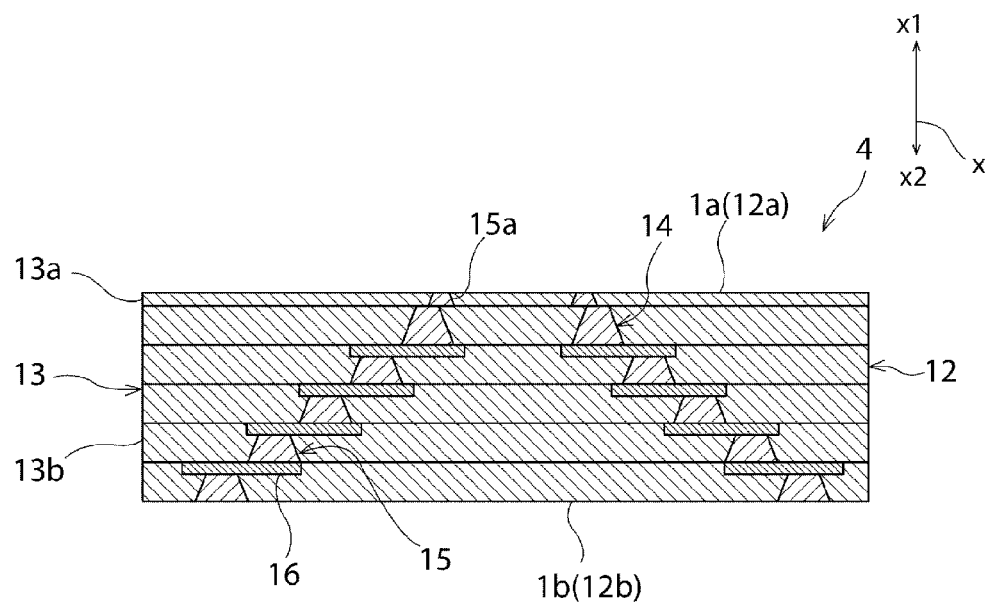
FIG. 5 is a schematic sectional view of a multilayer wiring substrate according to a third preferred embodiment of the present invention.

FIG. 4 is a schematic sectional view of a multilayer wiring substrate according to a second preferred embodiment of the present invention. FIG. 5 is a schematic sectional view of a multilayer wiring substrate according to a third preferred embodiment.

In the first preferred embodiment, the wiring lines 14 include the electrodes 16, which are each disposed at an interface between the insulator layers 13b adjacent to one another in the thickness direction. A multilayer wiring substrate 3 according to the second preferred embodiment is different from the multilayer wiring substrate 1 according to the first preferred embodiment in that, as illustrated in FIG. 4, the wiring lines 14 of the multilayer wiring substrate 3 include the plurality of via conductors 15 electrically directly connected to one another without the interface electrodes disposed therebetween.

In the present preferred embodiment, the wiring lines 14 preferably each include only the plurality of via conductors 15. Thus, desirable high frequency characteristics are realized.

However, the present invention is not limited to this structure. For example, as is the case with a multilayer wiring substrate 4 illustrated in FIG. 5 according to a third preferred embodiment, the via conductors 15 adjacent to one another in the thickness direction may be electrically connected to one another through the electrodes 16.

Figure 24:
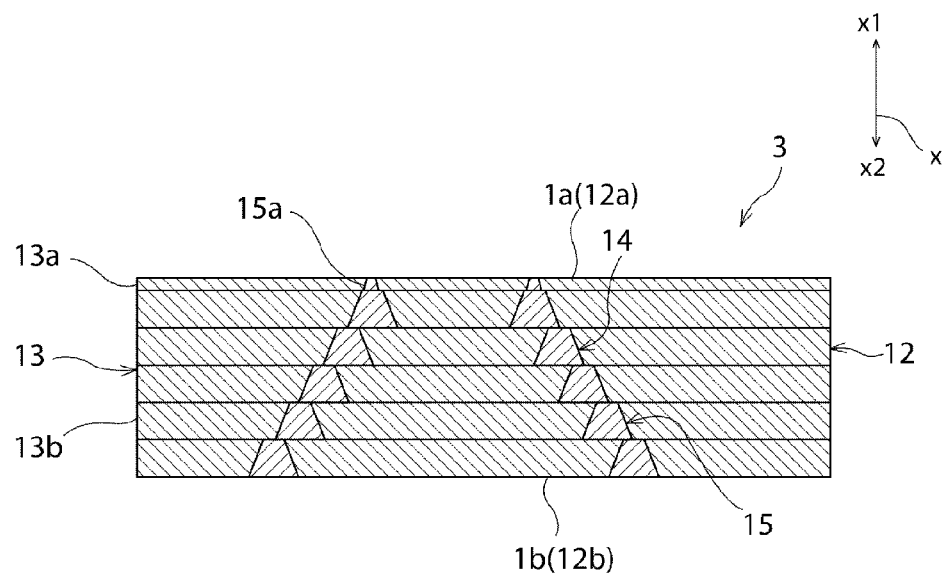
FIG. 24 is a schematic sectional view of a multilayer wiring substrate according to a variant of the second preferred embodiment of the present invention.

Also, as illustrated in FIG. 24, the via conductors 15a disposed in the topmost layer may be entirely located on the respective via conductors 15 disposed in the layer below the topmost layer.

Fourth Preferred Embodiment

Figure 6:
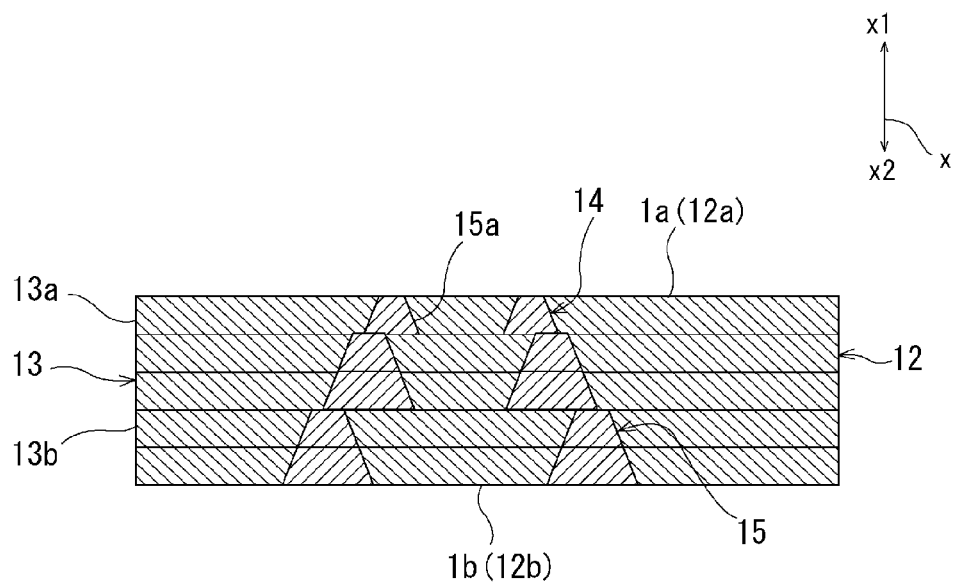
FIG. 6 is a schematic sectional view of a multilayer wiring substrate according to a fourth preferred embodiment of the present invention.

FIG. 6 is a schematic sectional view of a multilayer wiring substrate according to a fourth preferred embodiment of the present invention. In the fourth preferred embodiment, the thicknesses of all the insulator layers 13 preferably are the same, and the plurality of via conductors 15 are continuously arranged in at least two layers out of the insulator layers 13 other than the topmost insulator layer. With such a structure, by using the insulator layers 13 having the same thicknesses, the via diameter of the via conductors 15a formed in the first insulator layer 13a is relatively reduced compared to the via diameter of the other via conductors 15.

Fifth and Sixth Preferred Embodiments

Figure 7:
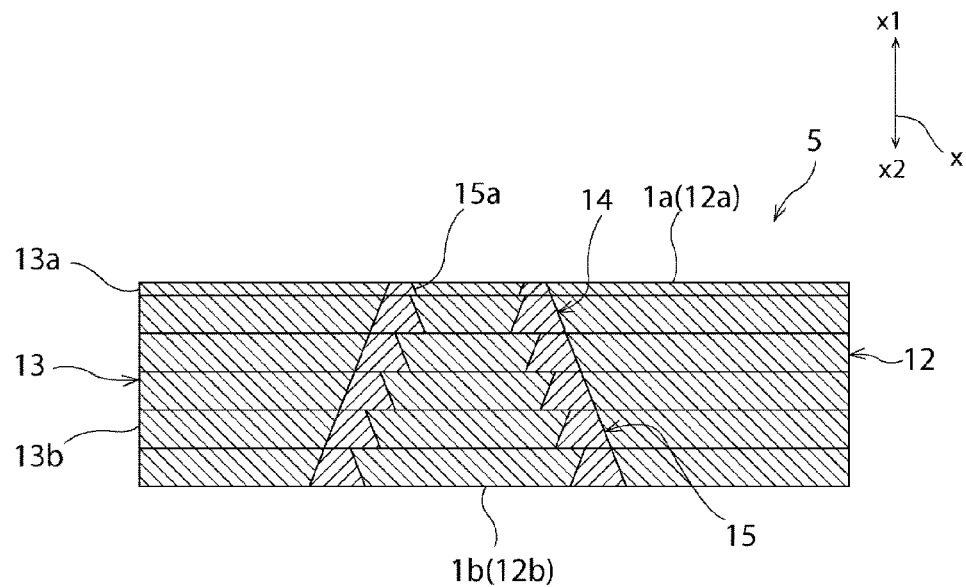
FIG. 7 is a schematic sectional view of a multilayer wiring substrate according to a fifth preferred embodiment of the present invention.
Figure 8:
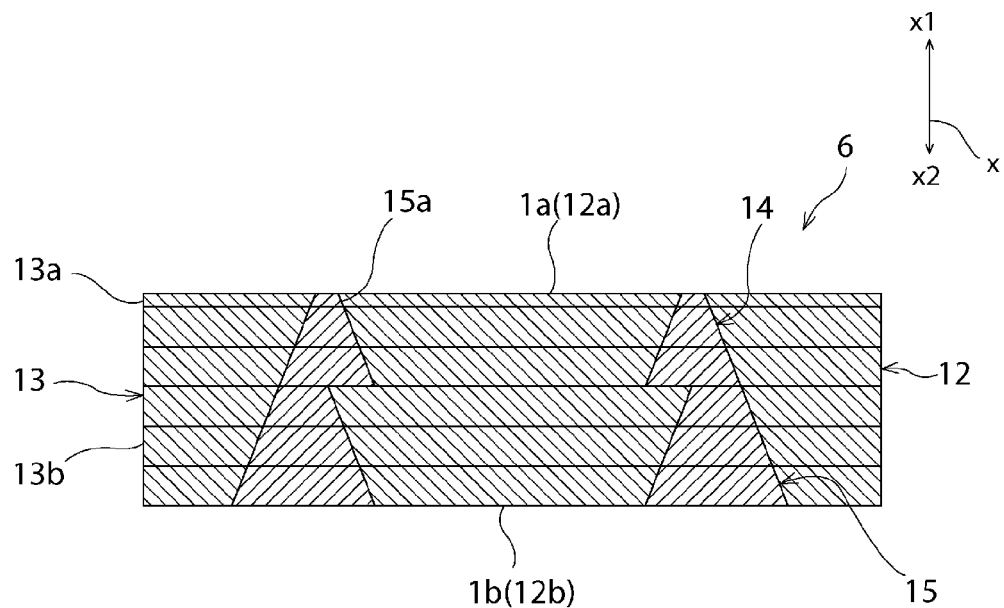
FIG. 8 is a schematic sectional view of a multilayer wiring substrate according to a sixth preferred embodiment of the present invention.

FIG. 7 is a schematic sectional view of a multilayer wiring substrate according to a fifth preferred embodiment of the present invention. FIG. 8 is a schematic sectional view of a multilayer wiring substrate according to a sixth preferred embodiment of the present invention.

As illustrated in FIGS. 7 and 8, in multilayer wiring substrates 5 and 6 according to the fifth and sixth preferred embodiments, at least one of the plurality of wiring lines 14 includes a portion in which wall surfaces of the via conductors adjacent to one another in the thickness direction are at least partially continuous with one another. Thus, more desirable high frequency characteristics are realized.

Furthermore, in the multilayer wiring substrate 6, at least one of the plurality of wiring lines 14 includes portions where the via conductors 15 adjacent to one another in the thickness direction in combination have a shape tapering from the second main surface 12b side toward the first main surface 12a side. Thus, even more desirable high frequency characteristics are realized.

From the viewpoint of realizing even more desirable high frequency characteristics, it is preferable that the entirety of the wiring line 14 has a shape tapering from the second main surface 12b side toward the first main surface 12a side. However, in this case, the diameter of the wiring lines 14 on the second main surface 12b may be excessively large. Thus, the wiring line 14 preferably includes a plurality of portions where the via conductors 15 adjacent to one another in the thickness direction in combination have a shape tapering from the second main surface 12b side toward the first main surface 12a side.

Seventh and Eighth Preferred Embodiments

Figure 9:
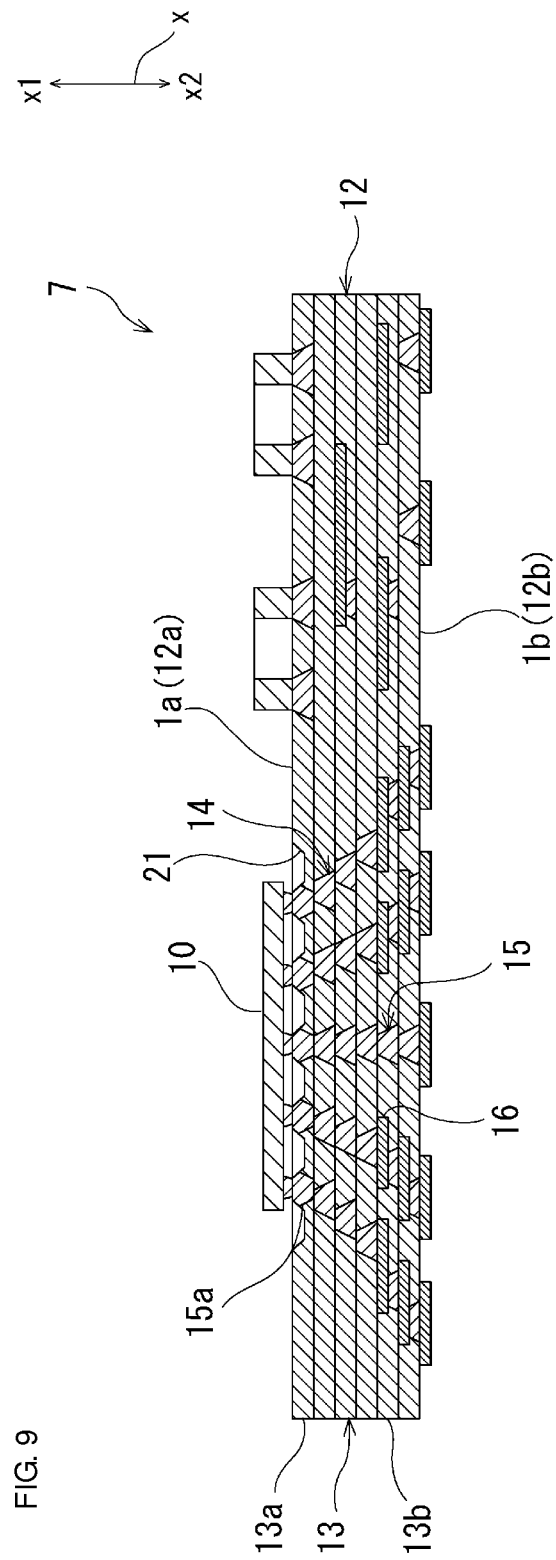
FIG. 9 is a schematic sectional view of a multilayer wiring substrate according to a seventh preferred embodiment of the present invention.
Figure 10:
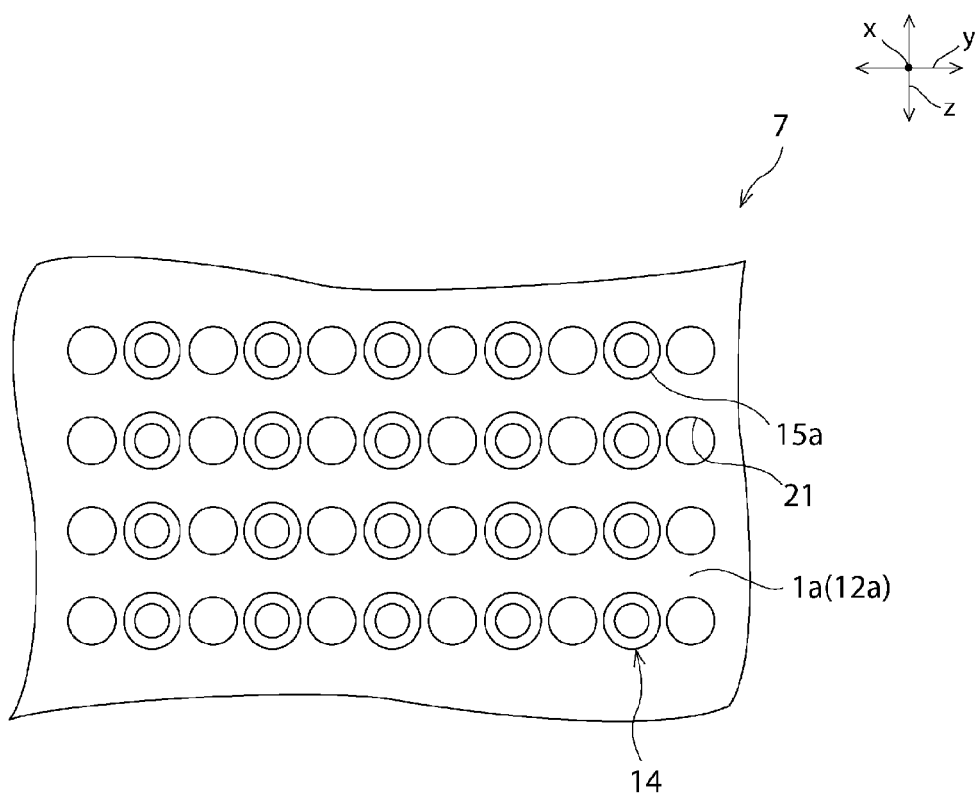
FIG. 10 is a schematic plan view of a portion of the multilayer wiring substrate according to the seventh preferred embodiment of the present invention.
Figure 12:
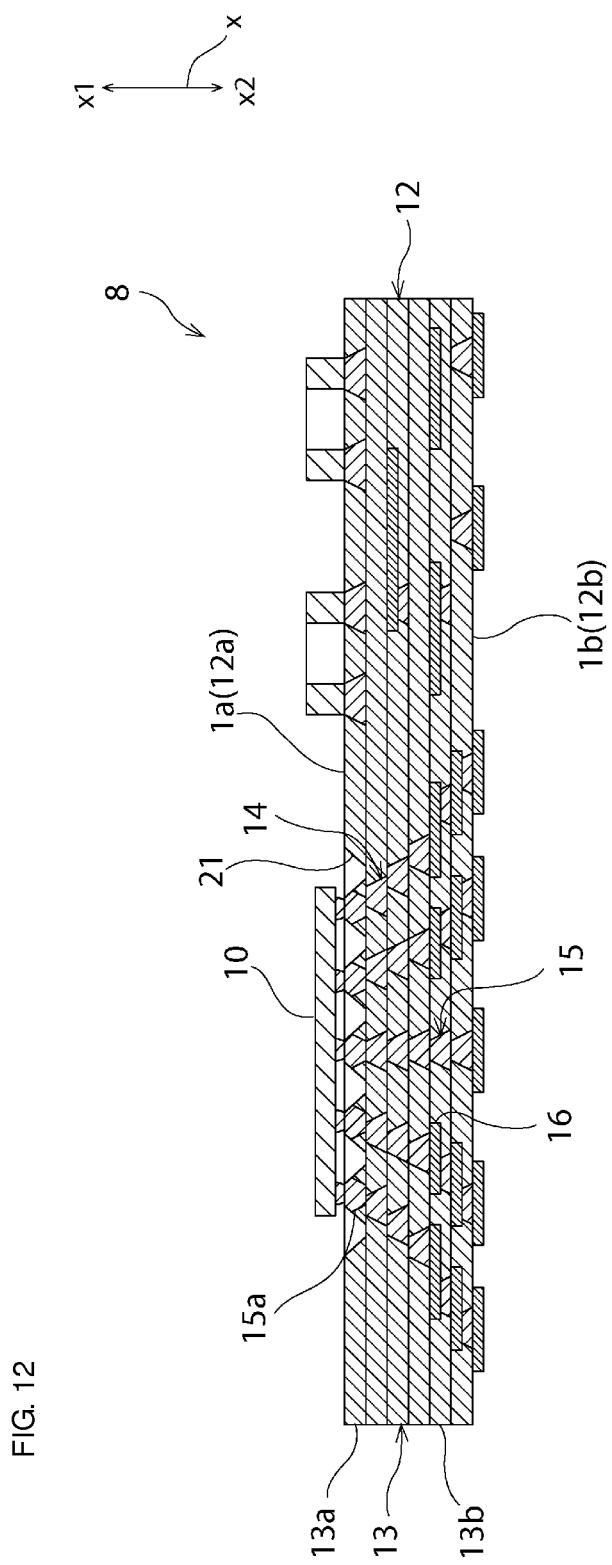
FIG. 12 is a schematic sectional view of a multilayer wiring substrate according to an eighth preferred embodiment of the present invention.

FIG. 9 is a schematic sectional view of a multilayer wiring substrate 7 according to a seventh preferred embodiment of the present invention. FIG. 10 is a schematic plan view of a portion of the multilayer wiring substrate according to a seventh preferred embodiment of the present invention. FIG. 12 is a schematic sectional view of a multilayer wiring substrate according to an eighth preferred embodiment of the present invention. FIG. 10 is referred to as in the eighth preferred embodiment as well as in the seventh preferred embodiment.

The multilayer wiring substrates 7 and 8 according to the seventh and eighth preferred embodiments have a similar structure as that of the multilayer wiring substrate 1 according to the first preferred embodiment except for the structures of the first insulative substrate 13a and the via conductors 15a. Thus, description here is dedicated to the difference between the multilayer wiring substrate 1 and the multilayer wiring substrates 7 and 8. Other structures are in accordance with the description of the first preferred embodiment.

In the seventh and eighth preferred embodiments, the first main surface 12a that defines the mounting surface 1a includes at least one recess portion 21. The recess portion 21 is positioned between the adjacent wiring lines 14 in the first main surface 12a. Specifically, as illustrated in FIG. 10, the wiring lines 14 are arranged in a matrix in the first main surface 12a. The pitch of the wiring lines 14 in the y-direction is comparatively small and the pitch of the wiring lines 14 in the z-direction is comparatively large. In the present preferred embodiments, the recess portions 21 are disposed between the wiring lines 14 adjacent to one another in the y-direction and not disposed between the wiring lines 14 adjacent to one another in the z-direction. However, according to various preferred embodiments of the present invention, the recess portion may be disposed between every space between the adjacent wiring lines 14. Alternatively, the recess portion may be formed to have, for example, a grid shape so as to surround portions of the wiring lines exposed at the first main surface.

Although the recess portions preferably have a circular or substantially circular shape in plan view in the present preferred embodiments, for example, the shape of the recess portions is not particularly limited. The recess portions may have, for example, a rectangular shape, a polygonal shape, an oval shape, or an elliptical shape, or a shape that conforms to the wiring lines 14.

As illustrated in FIG. 9, the recess portions 21 may preferably be configured so as not to reach the surface of the first insulator layer 13a opposite to the first main surface 12a. Alternatively, the recess portions 21 may be configured so as to reach the surface of the first insulator layer 13a opposite to the first main surface 12a as illustrated in FIG. 12.

As is the case with the first to sixth preferred embodiments, the thickness of the first insulator layer 13a is preferably smaller than the thickness of at least one of the plurality of insulator layers 13b and more preferably smaller than the thickness of each of the insulator layers 13b also in the present preferred embodiments. However, the thickness of the first insulator layer 13a is not necessarily smaller than the thickness of at least one of the plurality of insulator layers 13b. For example, the thickness of the first insulator layer 13a may be the same as the thickness of the insulator layers 13b.

In the present preferred embodiments, the via conductors 15a formed in the first insulator layer 13a include a portion that tapers from the mounting surface 1a (first main surface 12a) side (x1 side) toward the rear surface 1b (second main surface 12b) side (x2 side). Specifically, the via conductors 15a preferably have a shape that increases and then decreases in size from the x1 side toward the x2 side. A portion of the via conductors 15a that increases in size toward the x2 side is exposed at the recess portions 21.

Figure 11A:
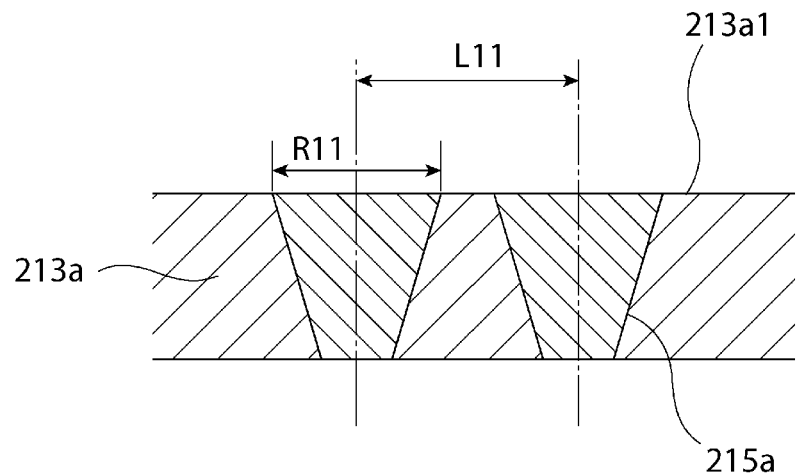
FIGS. 11A and 11B are a schematic sectional view of a first insulator layer of a multilayer wiring substrate according to a comparative example and a schematic sectional view of a first insulator layer of the multilayer wiring substrate according to the seventh preferred embodiment of the present invention, respectively.

For example, as illustrated in view of FIG. 11A, when via conductors 215a, which preferably have a shape tapering from a surface 213a1, are formed in an insulator layer 213a, a distance L11 between the adjacent via conductors 215a on the surface 213a1 preferably is larger than the diameter of the via conductors 215a on the surface 213a1. This distance is necessary to avoid a situation in which the adjacent via conductors 215a are short circuited. Thus, it is difficult to reduce the distance L11.

Figure 11B:
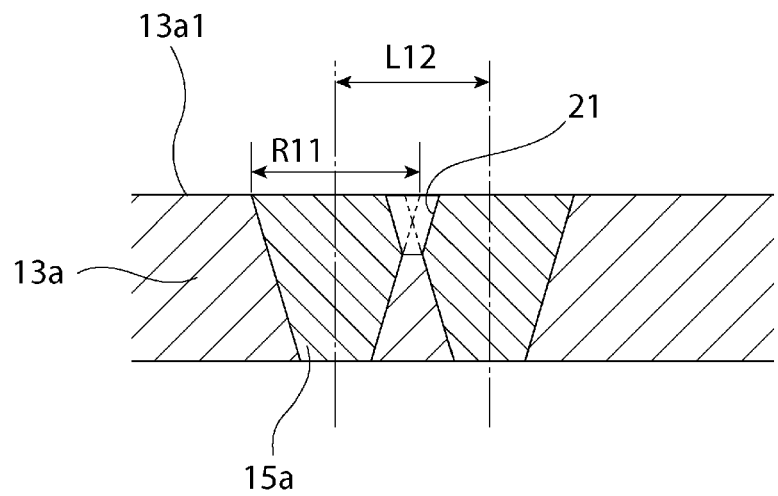

In contrast, in the present preferred embodiments, the recess portions 21 are provided between the adjacent via conductors 15a as illustrated in view of FIG. 11B. Thus, even when a distance L12 between the adjacent via conductors 15a is reduced, the adjacent via conductors 15a are not short-circuited. Accordingly, the distance L12 is significantly reduced. For example, the distance L12 preferably is reduced to a length shorter than the diameter of the via conductors 15a on the surface 13a1. Thus, the pitch of the adjacent wiring lines 14 on the mounting surface 1a is significantly reduced.

Figure 13:
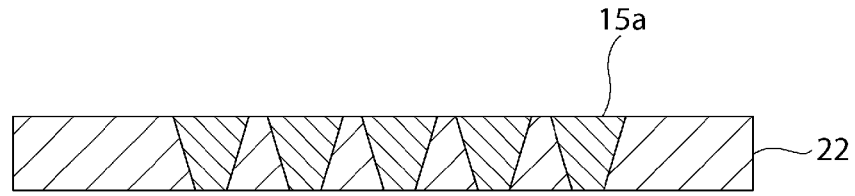
FIG. 13 is a schematic sectional view for explaining a manufacturing step of the multilayer wiring substrate according to the seventh preferred embodiment of the present invention.
Figure 14:
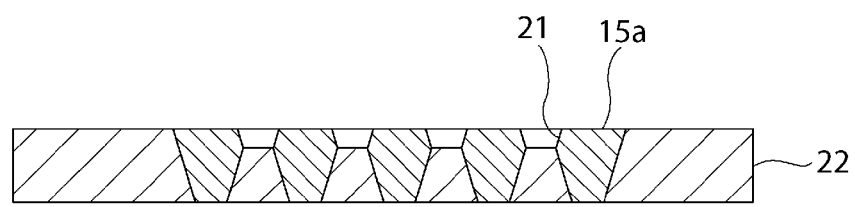
FIG. 14 is a schematic sectional view for explaining a manufacturing step of the multilayer wiring substrate according to the seventh preferred embodiment of the present invention.
Figure 15:
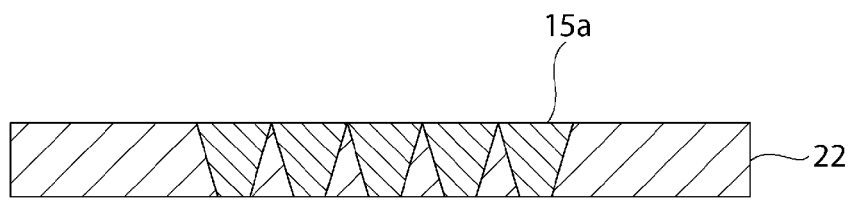
FIG. 15 is a schematic sectional view for explaining a manufacturing step of the multilayer wiring substrate according to the eighth preferred embodiment of the present invention.
Figure 16:
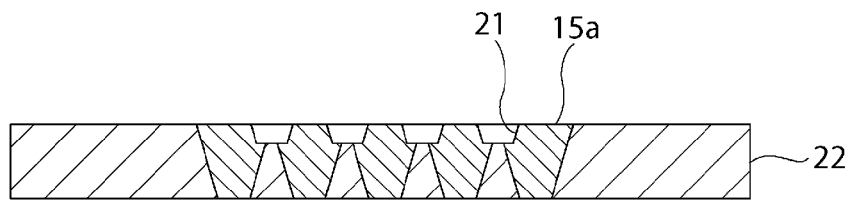
FIG. 16 is a schematic sectional view for explaining a manufacturing step of the multilayer wiring substrate according to the eighth preferred embodiment of the present invention.

In the manufacture of the multilayer wiring substrates 7 or 8, as illustrated in FIG. 13 or 15, the plurality of via conductors 15a are initially formed in a ceramic green sheet 22 for forming the first insulator layer 13a. After that, as illustrated FIG. 14 or 16, the recess portions 21 are formed. The via conductors 15a can be formed by initially forming through holes and then filling the through holes with electrically conductive paste. In forming through holes, a plurality of through holes may be formed such that, as illustrated in FIG. 13, the adjacent through holes are not in contact with one another. Alternatively, the plurality of through holes may be formed such that, as illustrated in FIG. 14, the adjacent through holes are connected to one another on the surface of the ceramic green sheet 22. With such a structure, the pitch of the wiring lines 14 is even more reduced. In this case, the adjacent via conductors are connected to one another immediately after the through holes are filled with an electrically conductive paste. However, since the recess portions 21 are formed, the adjacent via conductors are electrically insulated at last.

The recess portions 21 may be formed before the multilayer structure is formed or after the multilayer structure has been formed.

Figure 17:
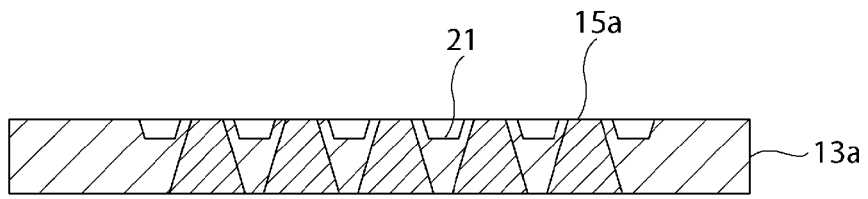
FIG. 17 is a schematic sectional view of a first insulator layer according to a first variant of a preferred embodiment of the present invention.
Figure 18:
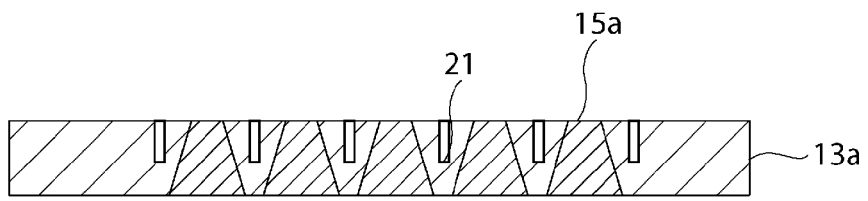
FIG. 18 is a schematic sectional view of a first insulator layer according to a second variant of a preferred embodiment of the present invention.

In the present preferred embodiments, the recess portions are preferably formed by removing a portion of each of the adjacent via conductors. However, as illustrated in FIGS. 17 and 18, the recess portions 21 may be formed between the adjacent via conductors 15a without removing any portion of each of the adjacent via conductors 15a. In the manufacture of the multilayer wiring substrate, the distance between the adjacent via conductors 15a is significantly reduced. In this case, however, in a step of filling the through holes of the ceramic green sheet with the electrically conductive paste from one of the main surface sides, the electrically conductive paste may protrude on the other main surface side of the ceramic green sheet, resulting in a short circuit. For this reason, there is a limit in reducing the distance between the adjacent via conductors 15a. In the present preferred embodiments, the through holes are filled with the electrically conductive paste, and after that, the recess portions are formed between the adjacent via conductors on the other main surface side of the ceramic green sheet. This can electrically insulate the adjacent via conductors from one another. Thus, the distance between the adjacent via conductors 15a is significantly reduced compared to that of related art. That is, the pitch of the wiring lines is significantly reduced.

Ninth to Eleventh Preferred Embodiments

Figure 19:
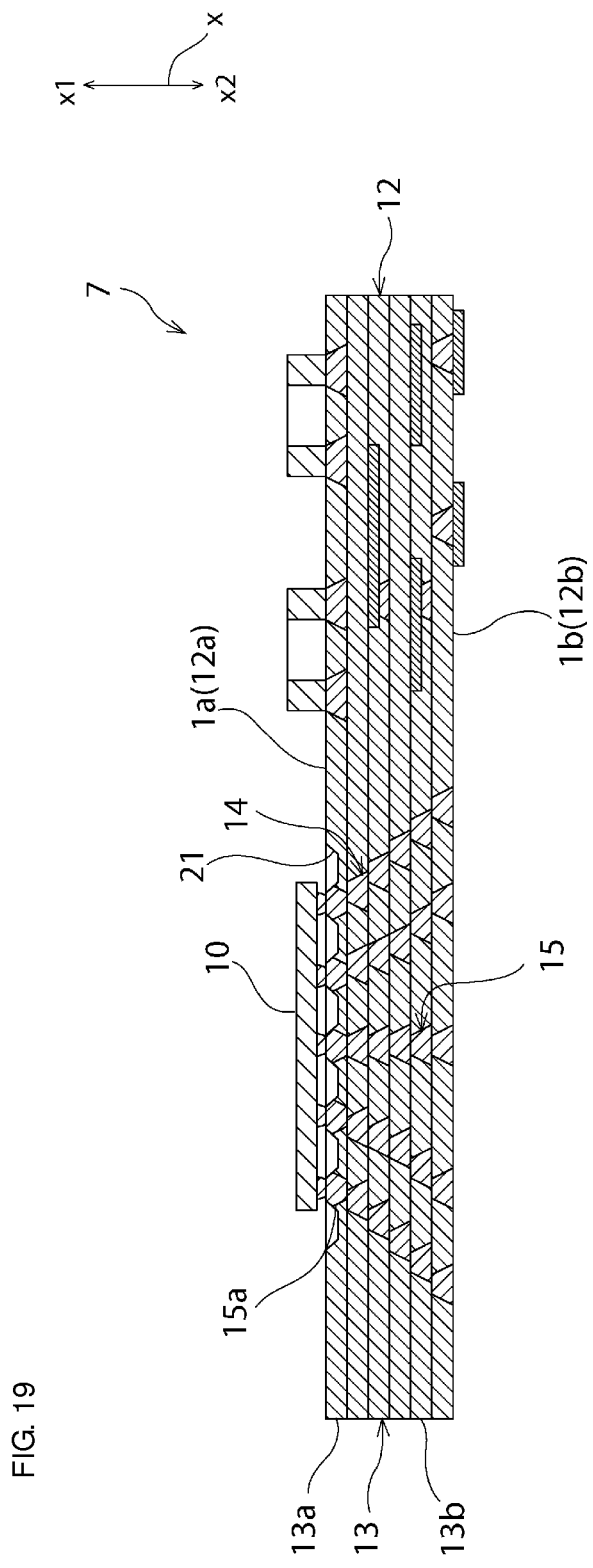
FIG. 19 is a schematic sectional view of a multilayer wiring substrate according to a ninth preferred embodiment of the present invention.
Figure 20:
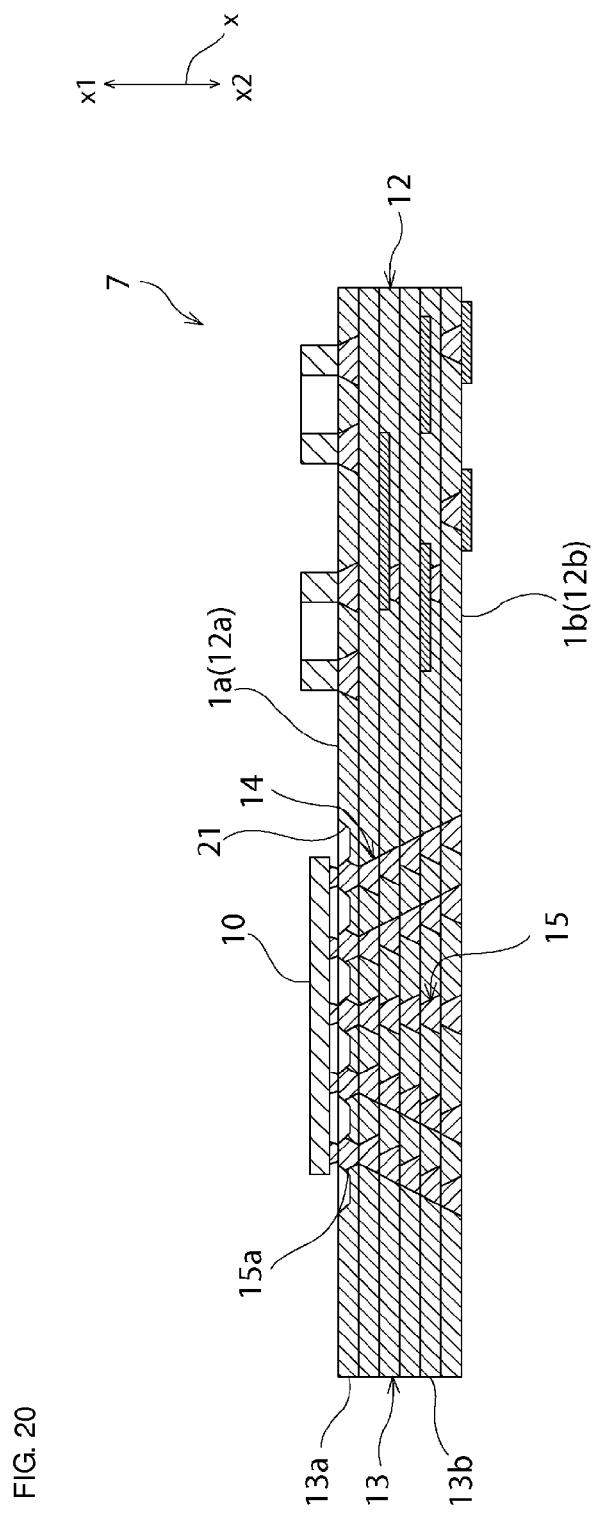
FIG. 20 is a schematic sectional view of a multilayer wiring substrate according to a tenth preferred embodiment of the present invention.
Figure 21:
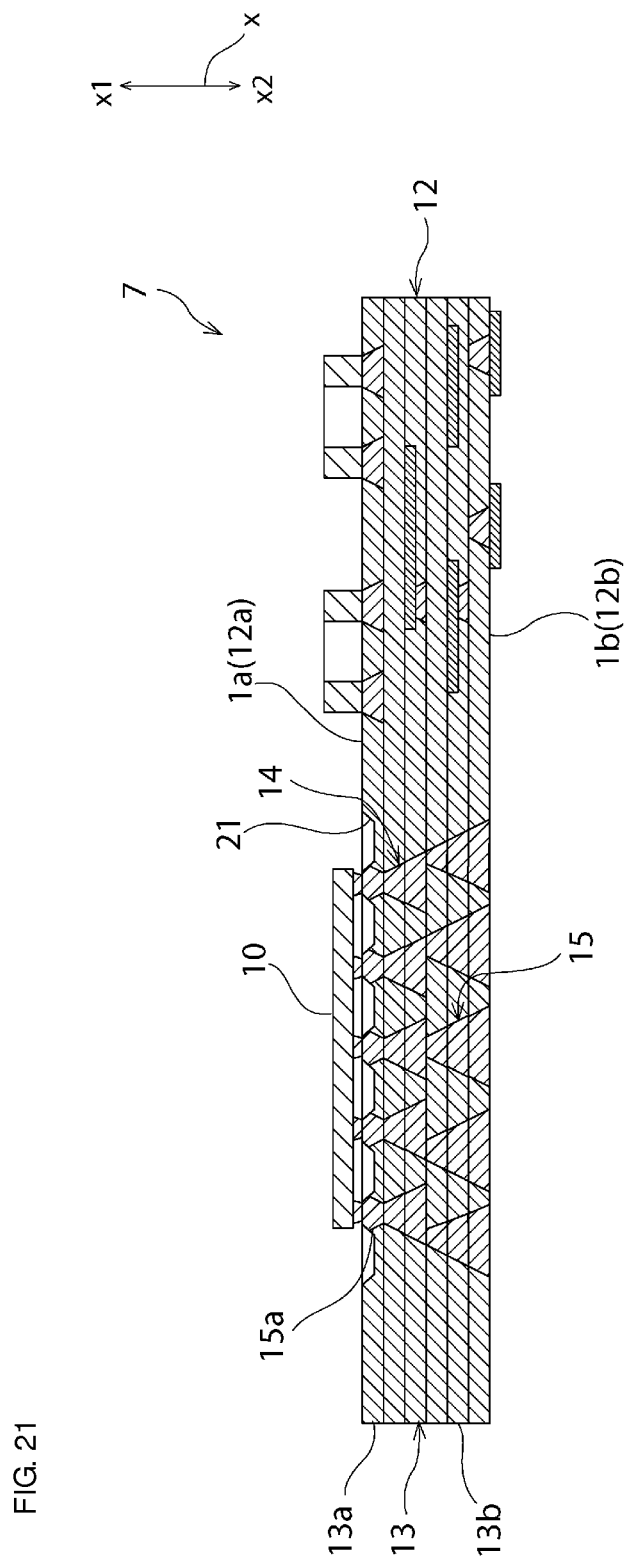
FIG. 21 is a schematic sectional view of a multilayer wiring substrate according to an eleventh preferred embodiment of the present invention.

FIG. 19 is a schematic sectional view of a multilayer wiring substrate according to a ninth preferred embodiment of the present invention. FIG. 20 is a schematic sectional view of a multilayer wiring substrate according to a tenth preferred embodiment of the present invention. FIG. 21 is a schematic sectional view of a multilayer wiring substrate according to an eleventh preferred embodiment of the present invention.

In the ninth preferred embodiment, as illustrated in FIG. 19, the wiring lines 14 include the plurality of via conductors 15 electrically directly connected to one another without the interface electrodes disposed therebetween similarly to the second preferred embodiment. This is different from the case with the multilayer wiring substrate 7 according to the seventh preferred embodiment.

In the present preferred embodiment, the wiring lines 14 each include only the plurality of via conductors 15. Thus, desirable high frequency characteristics are realized.

As illustrated in FIG. 20, in the tenth preferred embodiment, at least one of the plurality of wiring lines 14 includes a portion in which wall surfaces of the via conductors adjacent to one another in the thickness direction are at least partially continuous with one another. Thus, more desirable high frequency characteristics are realized.

Furthermore, in the eleventh preferred embodiment, at least one of a plurality of the wiring lines 14 includes portions in which the via conductors 15 adjacent to one another in the thickness direction in combination have a shape tapering from the second main surface 12b side toward the first main surface 12a side. Thus, side surfaces of the via conductors 15 have a linear shape instead of being bent, and accordingly, even more desirable high frequency characteristics are realized.

Twelfth Preferred Embodiment

Figure 22:
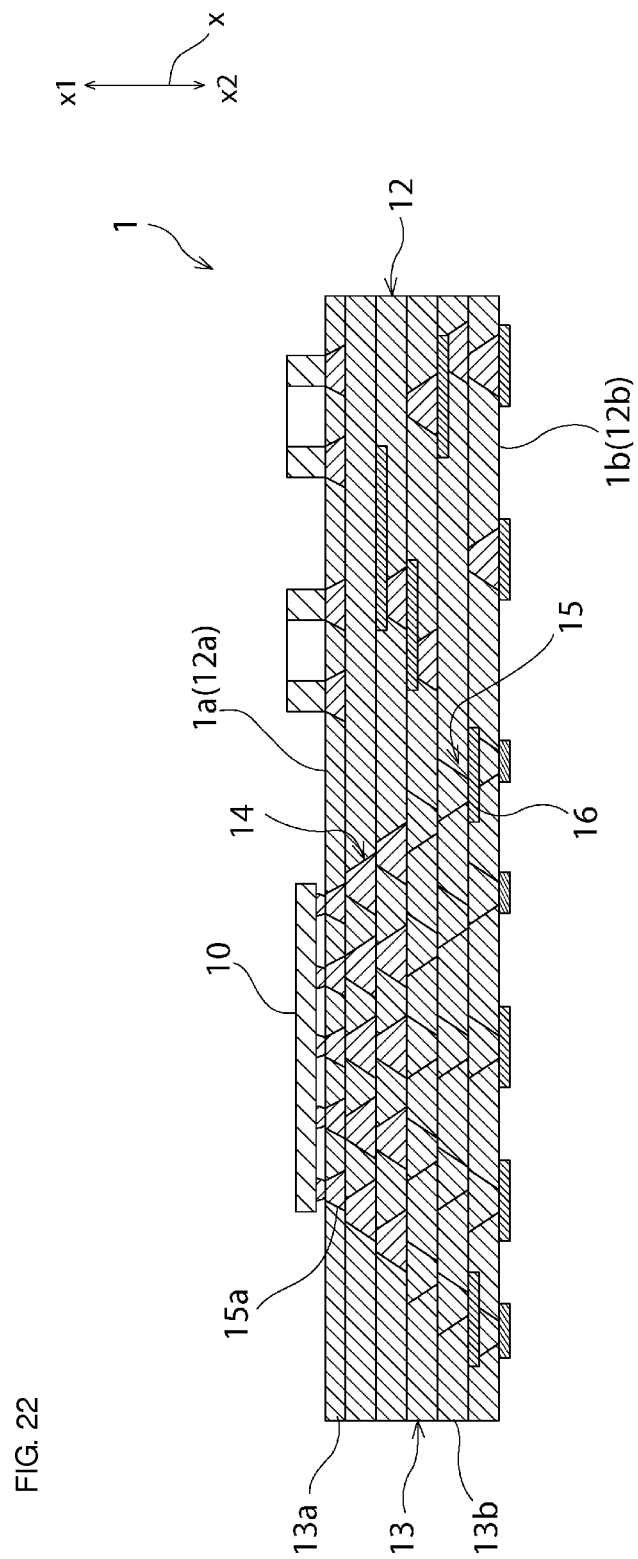
FIG. 22 is a schematic sectional view of a multilayer wiring substrate according to a twelfth preferred embodiment of the present invention.

FIG. 22 is a schematic sectional view of a multilayer wiring substrate according to a twelfth preferred embodiment of the present invention. As illustrated in FIG. 22, in the twelfth preferred embodiment, the via conductors 15 of the plurality of wiring lines 14 are disposed in the substrate main body 12 similarly to the first preferred embodiment. However, unlike the first preferred embodiment, the tapering direction of the via conductors 15 is inverted in the middle of the substrate main body 12. At least the via conductors 15 of the insulator layer 13 that defines the second main surface 12b are made to taper from the first main surface 12a side (x1 side) toward the first main surface 12a side (x2 side), thus permitting the distance between the wiring lines 14 on the second main surface 12b to be increased.

Thirteenth Preferred Embodiment

Figure 23:
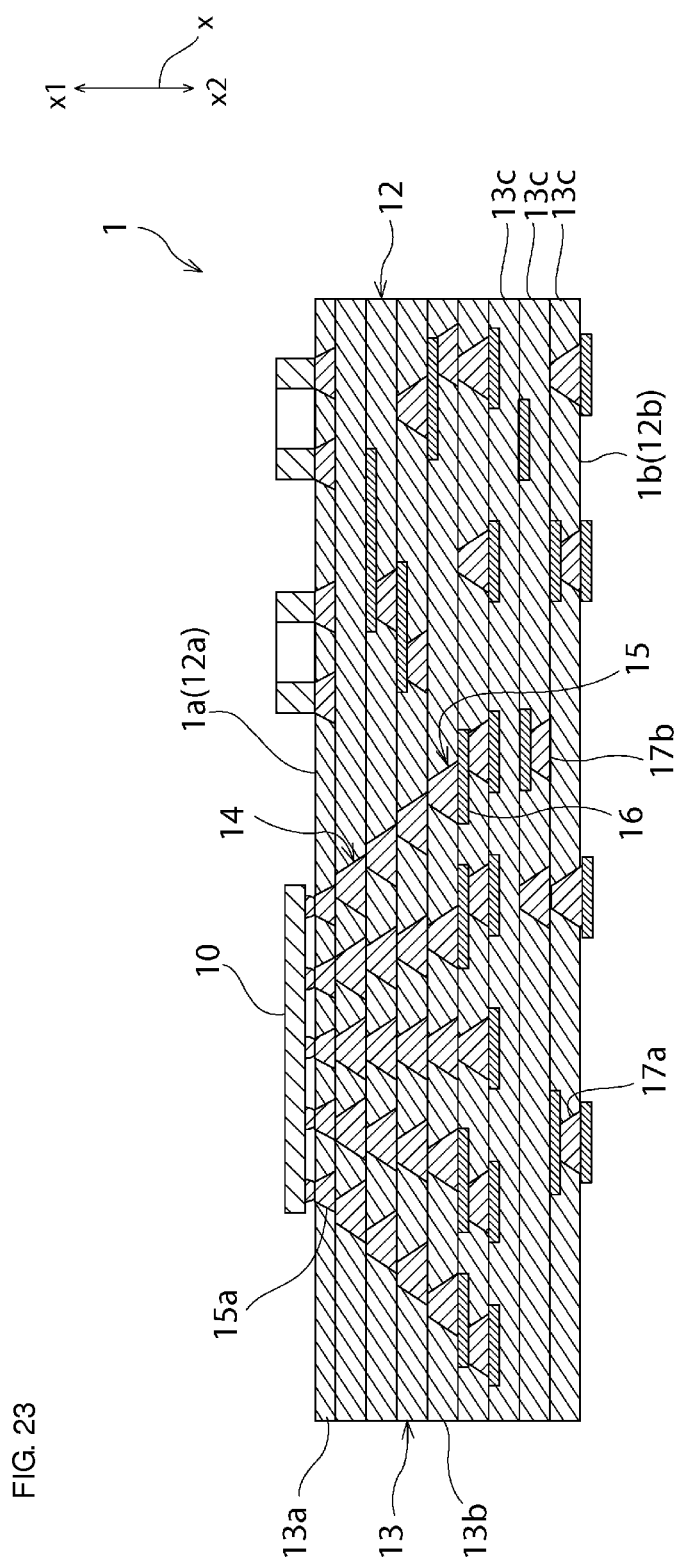
FIG. 23 is a schematic sectional view of a multilayer wiring substrate according to a thirteenth preferred embodiment of the present invention.

FIG. 23 is a schematic sectional view of a multilayer wiring substrate according to a thirteenth preferred embodiment of the present invention. As illustrated in FIG. 23, the plurality of wiring lines 14, which are defined by the first main surface 12a toward the second main surface 12b side in the substrate main body 12, may be arranged such that the plurality of wiring lines 14 do not reach the second main surface 12b. In this case, other circuits 17a and 17b can be provided in at least one insulator layer 13c, in which the plurality of wiring lines 14 are not provided. Even in such a case, the advantageous effects similar to those obtained in the aforementioned preferred embodiments can be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer wiring substrate comprising:
   a substrate main body including a first main surface and a second main surface; and
   a plurality of wiring lines provided in the substrate main body, the plurality of wiring lines extending from the first main surface toward the second main surface side; wherein
   the substrate main body includes a plurality of insulator layers laminated on top of one another;
   the plurality of wiring lines each include via conductors separately provided in the plurality of insulator layers;
   in at least one of the plurality of wiring lines, a diameter of the via conductor provided in a first insulator layer defining the first main surface of the substrate main body is smaller than a diameter of the via conductor provided in at least one of the plurality of insulator layers other than the first insulator layer; and
   a distance between adjacent ones of the plurality of wiring lines continuously increases from the first main surface side toward the second main surface side.

2. The multilayer wiring substrate according to claim 1, wherein, in at least one of the plurality of wiring lines, the diameter of the via conductor provided in the first insulator layer is smaller than a diameter of the via conductor provided in any one of the plurality of insulator layers other than the first insulator layer.

3. The multilayer wiring substrate according to claim 1, wherein a thickness of the first insulator layer is smaller than a thickness of at least one of the plurality of insulator layers other than the first insulator layer.

4. The multilayer wiring substrate according to claim 1, wherein a thickness of the first insulator layer is smaller than a thickness of each of the plurality of insulator layers other than the first insulator layer.

5. The multilayer wiring substrate according to claim 1, wherein, in the first main surface, a recess portion is provided between the adjacent ones of the plurality of wiring lines.

6. The multilayer wiring substrate according to claim 5, wherein each of the adjacent ones of the plurality of wiring lines is exposed at a wall surface of the recess portion.

7. The multilayer wiring substrate according to claim 5, wherein, the recess portion surrounds portions of the wiring lines that are exposed at the first main surface.

8. The multilayer wiring substrate according to claim 5, wherein, in the insulator layer that defines the first main surface, the recess portion extends to a surface located on a side opposite to the first main surface.

9. The multilayer wiring substrate according to claim 1, wherein at least one of the plurality of via conductors has a shape that tapers from the second main surface side toward the first main surface side.

10. The multilayer wiring substrate according to claim 1, wherein, in each of the wiring lines, the plurality of via conductors are electrically directly connected to one another.

11. The multilayer wiring substrate according to claim 1, wherein central axes of the via conductors extend in a thickness direction of the insulator layers.

12. The multilayer wiring substrate according to claim 1, wherein at least one of the plurality of wiring lines includes a portion in which wall surfaces of the via conductors adjacent to one another in a thickness direction are at least partially continuous with one another.

13. The multilayer wiring substrate according to claim 1, wherein at least one of the plurality of wiring lines includes a portion in which the via conductors adjacent to one another in the thickness direction in combination have a shape that tapers from the second main surface side toward the first main surface side.

14. A probe card comprising:
the multilayer wiring substrate according to claim 1.

15. A method for manufacturing the multilayer wiring substrate according to claim 1, the method comprising the steps of:
preparing a plurality of ceramic green sheets to form the insulator layers;
forming through holes in the plurality of ceramic green sheets;
filling the through holes with electrically conductive paste to form the via conductors;
fabricating a raw multilayer structure by laminating the plurality of ceramic green sheets, the through holes of which have been filled with the electrically conductive paste; and
obtaining the multilayer wiring substrate by firing the raw multilayer structure; wherein
the step of forming the through holes includes irradiating the ceramic green sheets with laser light.

16. The method for manufacturing the multilayer wiring substrate according to claim 15, wherein
in one of the ceramic green sheets, a plurality of the through holes are formed such that the adjacent through holes are connected to one another on one main surface side; and
the one ceramic green sheet is laminated as an outermost layer so that the one main surface forms a main surface of the raw multilayer structure.

17. A multilayer wiring substrate comprising:
a substrate main body including a first main surface and a second main surface; and
a plurality of wiring lines provided in the substrate main body, the plurality of wiring lines extending from the first main surface toward the second main surface side; wherein
in the first main surface, a recess portion is provided between adjacent ones of the plurality of wiring lines; and
a distance between the adjacent ones of the plurality of wiring lines continuously increases from the first main surface side toward the second main surface side.

18. The multilayer wiring substrate according to claim 17, wherein each of the adjacent ones of the plurality of wiring lines is exposed at a wall surface of the recess portion.

19. The multilayer wiring substrate according to claim 17, wherein
the substrate main body includes a plurality of insulator layers laminated one on top of another; and
the wiring lines each include via conductors separately provided in the plurality of insulator layers.

20. The multilayer wiring substrate according to claim 17, wherein, the via conductors provided in the insulator layer that defines the first main surface have a portion that increases in size from a surface on a side opposite to the first main surface toward the first main surface side in the insulator layer.

* * * * *